United States Patent
Fang

(10) Patent No.: US 7,366,649 B2
(45) Date of Patent: Apr. 29, 2008

(54) METHOD FOR GENERATING AND EVALUATING A TABLE MODEL FOR CIRCUIT SIMULATION

(75) Inventor: Gang Peter Fang, Plano, TX (US)

(73) Assignee: Texas Instruments Incorporated, Dallas, TX (US)

( * ) Notice: Subject to any disclaimer, the term of this patent is extended or adjusted under 35 U.S.C. 154(b) by 380 days.

(21) Appl. No.: 10/992,091

(22) Filed: Nov. 18, 2004

(65) Prior Publication Data

US 2006/0015303 A1    Jan. 19, 2006

Related U.S. Application Data

(62) Division of application No. 10/894,455, filed on Jul. 19, 2004, now abandoned.

(51) Int. Cl.
*G06F 17/50* (2006.01)

(52) U.S. Cl. .............................. 703/15; 703/2; 703/14; 703/18; 716/5; 716/7; 716/8; 716/11; 716/18

(58) Field of Classification Search ................ 703/2, 703/15, 14, 18; 716/5, 7, 8, 11, 18; 345/590, 345/419, 585, 591, 593, 597, 600
See application file for complete search history.

(56) References Cited

U.S. PATENT DOCUMENTS

| | | | |
|---|---|---|---|
| 5,553,008 A | | 9/1996 | Huang et al. |
| 6,324,678 B1 * | 11/2001 | Dangelo et al. ............... 716/18 |
| 6,453,275 B1 * | 9/2002 | Schoenmaker et al. ......... 703/2 |
| 6,483,518 B1 * | 11/2002 | Perry et al. .................. 345/590 |
| 6,606,588 B1 * | 8/2003 | Schaumont et al. .......... 703/15 |
| 6,615,164 B1 * | 9/2003 | Gopisetty et al. .............. 703/2 |

OTHER PUBLICATIONS

Lewis, David M; "Device Model Approximation Using 2N Trees"; IEEE Transactions of Computer-Aided Design, vol. 9, No. 1, Jan. 1990.
Cheng and Li; "A Fast Method for MOS Model Evaluation in VLSI Simulation With Controllable Error"; China 1991 International Conference on Circuits and Systems; Jun. 1991; Shenzhen, China.
Nadezhin et al; "SOI Transistor Model for Fast Transient Simulation"; ICCAD '03 Nov. 11-13, 2003, San Jose, CA.
Fuchs, Kedem and Naylor; "On Visible Surface Generation by A Priori Tree Structures"; Association for Computing Machinery Copyright Notice 1980 ACM 0-89791-021-4/80/0700-0124.

\* cited by examiner

*Primary Examiner*—Paul Rodriguez
*Assistant Examiner*—Jonathan J Teets
(74) *Attorney, Agent, or Firm*—Wade J. Brady, III; Frederick J. Telecky, Jr.

(57) ABSTRACT

A method for generating and evaluating a table model for circuit simulation in N dimensions employing mathematical expressions for modeling a device. The table model uses an unstructured N-dimensional grid for approximating the expressions. The method includes the steps of: (a) establishing a function domain having boundary limits in the N dimensions; (b) performing an accuracy partitioning operation to establish accuracy partitions; the mathematical expressions being satisfied within each accuracy partition within a predetermined error criteria; (c) performing a continuity partitioning operation to establish continuity partitions ensuring continuity of solutions of the mathematical expressions across boundaries separating adjacent accuracy partitions; (d) performing a grid refining operation to configure the continuity partitions to assure monotonic solutions of the mathematical expressions in the continuity partitions; (e) if a continuity partition is altered during the grid refining operation, returning to step (c), else proceeding to next step; (f) ending the method.

3 Claims, 4 Drawing Sheets

METHOD FOR GENERATING AND EVALUATING A TABLE MODEL FOR CIRCUIT SIMULATION

This application is a Divisional Application based upon U.S. patent application Ser. No. 10/894,455 entitled "Method for Generating and Evaluating a Table Model for Circuit Simulation," filed Jul. 19, 2004 now abandoned.

BACKGROUND OF THE INVENTION

The present invention is directed to methods for evaluating device models in circuit simulators. Circuit simulators are computer programs that solve a system of mathematical expressions, such as algebraic differential equations, that describe or model a circuit. Simulators may construct the mathematical expressions, such as algebraic differential equations, from physical or analytical models of devices contained in the circuit. A physical or analytical model is basically a set of equations that express, for example, device currents and charges (or capacitances) as functions of the terminal voltages. A physical or analytical model may be employed to evaluate other parameters as well.

Sometimes weeks of computation are required to carry out a proper simulation of a complex circuit. It has been observed that simulators may spend a majority of the computation time (e.g., approximately 70%) in constructing the circuit equations (i.e., evaluating device models) rather than solving the equations. Another difficulty with such purely mathematical modeling is that it is often difficult and time consuming to extract a good model for a complex device or circuit.

One way to reduce the processor time required for device model evaluation is to replace the physical or mathematical model with a table model. In a table model, measured or precomputed device parameters, such as currents, capacitances or charges, are stored for different bias voltage points in a tabular form. Interpolation is employed for determining bias voltage values that do not coincide with value entries.

Some table models are based upon structured grids. Structured grids are characterized by regular connectivity. With structured regular connectivity, the points of the grids can be indexed and the neighbors of each point can be calculated rather than looked up. For example, in a structured grid the neighbors of a point (i,j) are located at (i+1,j), (i−1,j), and so on. Some desirable properties for device models, such as continuity and monotonicity, can be preserved in structured grid systems if proper interpolation schemes are employed. However, one drawback of a structured grid system is that its accuracy is limited by the available computer memory, especially as the number of dimensions increases.

Other table models may be based upon unstructured grids. An example of such an unstructured grid table model employs a tree-based model approximation (TBMA) method. TBMA is a method to split the root partition, which is the function domain of interest, recursively. The function domain is partitioned continuously until the difference between the actual functional values and the interpolated values in all partitions meet specified error or tolerance criteria. When the error inside one partition is less than the specified tolerance, the division of that partition is stopped but division of the other partitions is continued unless they meet the error or tolerance criteria also. As a result, smaller partitions appear at regions of the domain where the function is more nonlinear. On the other hand, if the function is approximately linear large partitions will be sufficient to give the required accuracy. The divided function domain is represented by a modified $2^N$ tree where N is the dimension of the function domain. A $2^N$ tree is a tree in which each interior node has exactly $2^N$ descendants, each of which represents a partition of the function domain.

An example of an unstructured grid device model is described in "Device Model Approximation Using 2N Trees", by David M. Lewis; IEEE Transactions on Computer-Aided Designs, Vol. 9, No. 1; January 1990. Lewis describes an application of $2^N$ trees to device model approximation in which the domain of the device model functions is partitioned using a modified $2^N$ tree with smaller partitions where the function is more nonlinear. An application of Lewis' approach is described for approximating MOSFET models by Cheng and Li in "A Fast Method for MOS Model Evaluation in VLSI Simulation with Controllable Error", China 1991 International Conference on Circuits and Systems; June 1991. An application of Lewis' approach is described for approximating SOI transistor models by Nadzhin et al. in "SOI Transistor Model for Fast Transient Simulation", ICCAD '03; Nov. 11-13, 2003.

Lewis describes partitioning a domain into accuracy partitions to preserve accuracy of modeling using the table embodied in the grid. Then Lewis describes a complex procedure involving evaluation of constraints to further partition the domain for purposes of preserving continuity of the table model.

There is a need for a simpler, more straightforward approach to establishing a table model approximation for evaluating a complex device.

There is a need for a table model approximation method for evaluating a device that preserves the monotonicity and continuity of a model while reducing computation time for model evaluation.

SUMMARY OF THE INVENTION

A method for generating and evaluating a robust and efficient table model for circuit simulation in N dimensions employing mathematical expressions for modeling a device that preserves continuity and monotonicity of analytical device models. The table model uses an unstructured N-dimensional grid for approximating the expressions (device model functions). The method includes the steps of: (a) establishing a device function domain having boundary limits in the N dimensions; (b) performing an accuracy partitioning operation to establish accuracy partitions; the mathematical expressions being satisfied within each accuracy partition within a predetermined error criteria; (c) performing a continuity partitioning operation to establish continuity partitions ensuring continuity of solutions of the mathematical expressions across boundaries separating adjacent accuracy partitions; (d) performing a grid refining operation to configure the continuity partitions to assure monotonic solutions of the mathematical expressions in the continuity partitions; (e) if a continuity partition is altered during the grid refining operation, returning to step (c), else proceeding to next step; (f) ending the method.

It is, therefore, an object of the present invention to provide a method for evaluating a device that is a simple, straightforward approach to establishing a table model approximation for evaluating a complex device.

It is a further object of the present invention to provide a method for evaluating a device that preserves the monotonicity and continuity of a model while reducing computation time for model evaluation.

Further objects and features of the present invention will be apparent from the following specification and claims when considered in connection with the accompanying drawings, in which like elements are labeled using like reference numerals in the various figures, illustrating the preferred embodiments of the invention.

DETAILED DESCRIPTION OF THE PREFERRED EMBODIMENT

The method of the present invention may be employed to approximate or simulate any (N+1)-terminal (where $N \geq 2$) device models. By way of example and not by way of limitation, such devices include bipolar junction transistors (BJT), 3-dimensional devices (for example, FinFET; a MOSFET transistor that includes a three dimensional fin structure), heterostructure devices, optoelectronic devices, micro electromechanical systems (MEMS) and other devices, so long as the device functions are continuous.

For the sake of simplicity of explanation and illustration, the method of the present invention will be described in two dimensions (N=2). Those skilled in the art of device modeling or circuit simulation will recognize the utility of the method when N>2.

Figure 1:
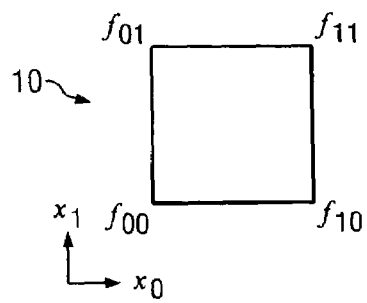
FIG. 1 is a representative unpartitioned two-dimensional function domain.

FIG. 1 is a representative unpartitioned two-dimensional function domain. In FIG. 1, a function domain 10 relating to a function $f(x_0, x_1)$—a function of the independent variables $x_0$, $x_1$—is illustrated with respect to axes $x_0$ and $x_1$. Points in function 10 may be referenced by calling out their coordinates $(x_0, x_1)$. The value of function $f(x_0, x_1)$ at a given point in function 10 is indicated by the term $fx_0x_1$. Following this convention, the value of function $f(x_0, x_1)$ at $x_0=0$ and $x_1=0$ is indicated by the term f00. The value of function $f(x_0, x_1)$ at $x_0=1$ and $x_1=0$ is indicated by the term f10. The value of function $f(x_0, x_1)$ at $x_0=1$ and $x_1=1$ is indicated by the term f11. The value of function $f(x_0, x_1)$ at $x_0=0$ and $x_1=1$ is indicated by the term f01.

Figure 2:
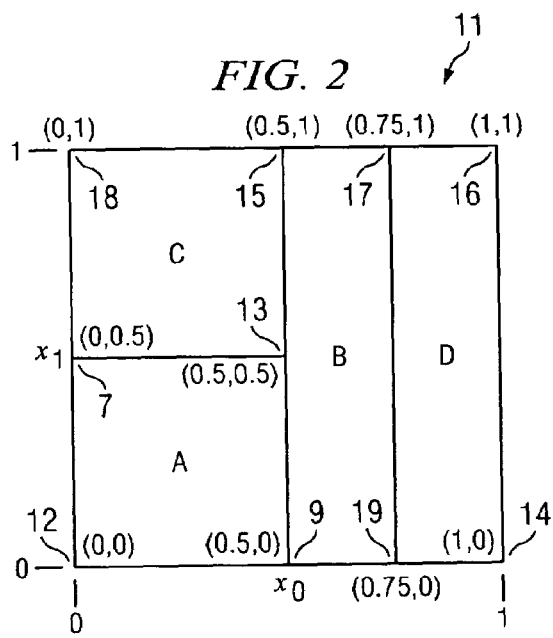
FIG. 2 is a representative two-dimensional function domain with accuracy partitions.

FIG. 2 is a representative for a two-dimensional function domain with accuracy partitions. In FIG. 2, function domain 11 is characterized as a unity square that is defined by a pair of diagonal corners, point 12 at (0,0) and point 16 at (1,1). Function domain 11 is partitioned into a plurality of partitions or cells A, B, C, D. Partitions A, B, C, D are accuracy partitions and are determined in a manner substantially similar to the method described for effecting accuracy partitioning by Lewis ["Device Model Approximation Using $2^N$ Trees", by David M. Lewis; IEEE Transactions on Computer-Aided Designs, Vol. 9, No. 1; January 1990]. That is, function domain 11 is recursively split using hyperplanes (when N=2, hyperplanes are lines) until predetermined error criteria are satisfied. The essence of accuracy partitioning function domain 11 is to assure that an interpolation in function domain 11 will yield an estimated solution for function f at a solution locus that is within a predetermined acceptable error of the actual solution of function f at that solution locus.

The process of accuracy partitioning may be described as a binary space partition (BSP) operation. Accuracy partitioning as employed with the method of the present invention is an example of a tree-based model approximation (TBMA) method, as discussed above in the Background of the Invention portion of this description. TBMA is a method to split the root partition, which is the function domain of interest, recursively. The function domain is partitioned continuously until the difference between the actual functional values and the interpolated values in all partitions meet the specified error criteria. When the error inside one partition is less than the specified tolerance, the division of that partition is stopped but division of the other partitions is continued unless they meet the error criteria also. As a result, smaller partitions appear at regions of the domain where the function is more nonlinear. On the other hand, if the function is approximately linear large partitions will be sufficient to give the required accuracy. The divided function domain is represented by a binary space partition (BSP) tree. Each node in the BSP tree represents a convex subspace or a partition. The root partition is the whole function domain 11. Leaf partitions are sometimes referred to as cells. Each BSP tree node stores a hyperplane that divides the space it represents into two halves, and stores references to two nodes that represent each half. In Lewis's work, the resulting BSP tree can be height compressed into a modified $2^N$ tree where N is the dimension of the function domain. The BSP tree is not compressed into a modified $2^N$ tree in present invention.

Function domain 11 has been accuracy partitioned to establish accuracy partitions or cells A, B, C, D. Accuracy partition or cell A is defined by corners 12 and 13 [i.e., points (0, 0) and (0.5, 0.5)]. Accuracy partition or cell B is defined by corners 9 and 17 [i.e., points (0.5, 0) and (0.75, 1)]. Accuracy partition or cell C is defined by corners 7 and 15 [i.e., points (0, 0.5) and (0.5, 1)]. Accuracy partition or cell D is defined by corners 19 and 16 [i.e., points (0.75, 0) and (1, 1)].

Interpolating a function f at point 13 (i.e., point (0.5, 0.5)), may be effected with respect to either accuracy partition A or accuracy partition B. With respect to accuracy partition A an interpolation function $\hat{f}$ is:

$$\hat{f}(0.5, 0.5) = f(0.5, 0.5) \quad [1]$$

With respect to accuracy partition B an interpolation function $\hat{f}$ is:

$$\hat{f}(0.5, 0.5) = \frac{f(0.5, 0) + f(0.5, 1)}{2} \quad [2]$$

If the solutions to expressions [1] and [2] differ, there is discontinuity of the interpolation function $\hat{f}$ at the boundary separating accuracy partitions A, B. This is dealt with using continuity partitions, as will be explained in detail in connection with FIG. 4.

Figure 3:
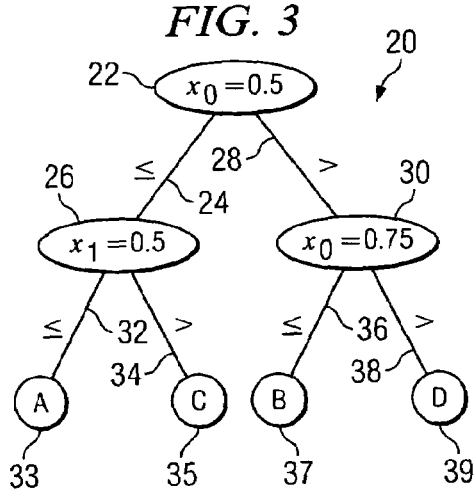
FIG. 3 is a two-dimensional binary space partition representation of the function domain illustrated in FIG. 2.

FIG. 3 is a two-dimensional binary space partition representation of the function domain illustrated in FIG. 2. In FIG. 3, a BSP tree 20 is illustrated that represents divided function domain 11 (FIG. 2). Tree 20 has a primary reference node 22 having a 1-D (i.e., one-dimensional) splitting hyperplane or a line: [$x_0$=0.5]. A branch 24 from reference node 22 connects with a secondary reference node 26 having a hyperplane or a line: [$x_1$=0.5]. A branch 28 from reference node 22 connects with a secondary reference node 30 having a hyperplane or a line: [$x_0$=0.75]. A branch 32 from secondary reference node 26 connects with a leaf 33 representing accuracy partition or cell A. A branch 34 from secondary reference node 26 connects with a leaf 35 representing accuracy partition or cell C. A branch 36 from secondary reference node 30 connects with a leaf 37 representing accuracy partition or cell B. A branch 38 from secondary reference node 30 connects with a leaf 39 representing accuracy partition or cell D.

One may observe that reference nodes 22, 26, 30 are related to intersections of partition edges with zero axes. Reference node 22 is related to intersection of a partition edge with the $x_1$=0 axis at a point (0.5, 0). Reference node 26 is related to intersection of a partition edge with the $x_0$=0 axis at a point (0, 0.5). Reference node 30 is related to intersection of a partition edge with the $x_1$=0 axis at a point (0.75, 0).

Inspecting FIG. 3 with reference to FIG. 2, one may notice that branch 24 includes $x_0$=0.5 and all points to the left of $x_0$=0.5. Branch 28 includes all points to the right of $x_0$=0.5. Branch 32 includes $x_1$=0.5 and all points to the left of $x_0$=0.5 for $x_1$=0.5 and for all points below $x_1$=0.5, viz; accuracy cell A. Branch 34 includes $x_0$=0.5 and all points to the left of $x_0$=0.5 for all points above $x_1$=0.5, viz; accuracy cell C. Branch 36 includes all points to the right of $x_0$=0.5 for $x_0$=0.75 and for all points to the left of $x_0$=0.75, viz; accuracy cell B. Branch 38 includes all points to the right of $x_0$=0.5 and for all points to the right of $x_0$=0.75, viz; accuracy cell D.

Once a function domain has been accuracy partitioned, there is still a risk that the function may have discontinuities between two accuracy partitions because there are multiple possible interpolations of the value of a function at a particular point, that is $f(x_0, x_1)$.

Figure 4:
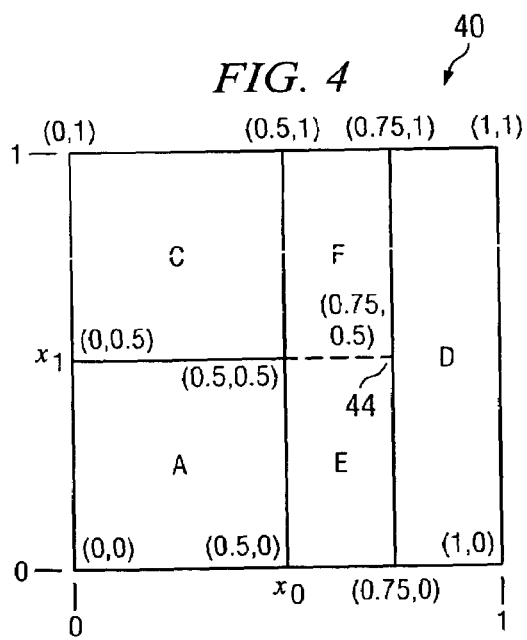
FIG. 4 is a representative two-dimensional function domain with accuracy partitions and continuity partitions.

FIG. 4 is a representative two-dimensional solution domain with accuracy partitions and continuity partitions. In FIG. 4, a function domain 40 is illustrated as a unity square defined by a pairs of corners ($x_0$, $x_1$): (0, 0) and (1, 1). Function domain 40 has been accuracy partitioned to establish accuracy cells A, C, D. An accuracy cell B was also established, as described and illustrated in connection with FIG. 2. However, evaluation of the function f ($x_0$, $x_1$) at point (0.5, 0.5) with respect to accuracy cells A and B yielded different results, thereby identifying a discontinuity (as described earlier herein in connection with expressions [1] and [2]). Point (0.5, 0.5) is a corner for accuracy cells A and C but an edge point for accuracy cell B. Since point (0.5, 0.5) is in the middle of an edge of cell B between corner (0.5,0) and corner (0.5,1), point (0.5, 0.5) is referred here as a middle edge point of cell B.

Having identified a condition of discontinuity at middle edge point (0.5, 0.5) of cell B, a discontinuity partitioning operation is performed, extending the intercell boundary between accuracy cells A, C (a line between points (0, 0.5) and (0.5, 0.5)) to intersect the next boundary encountered. In this exemplary illustration in FIG. 4, the intercell boundary between accuracy cells A, C is extended to the right hand boundary of accuracy cell B (a line between points (0.75, 0) and (0.75, 1)). In this manner, a pseudo boundary 42 is established (indicated by a dotted line between points (0.5, 0.5) and (0.75, 0.5)) dividing accuracy cell B into continuity cells E and F. A pseudo locus or pseudo point 44 is thus established at the new termination of the pseudo boundary at point.

It should be kept in mind that FIGS. 2 and 4 are much-simplified exemplary function domain partitioning arrangements. For one thing, edge points may also occur in connection with vertically oriented intercell boundaries. Another, more important consideration is that a typical evaluation or simulation using a tree-based model approximation (TBMA) method involves many thousands of partitions or cells. Even more important a consideration is that high-dimensional models (N>2) are very complex. Nevertheless, as mentioned earlier herein, such TBMA methods are preferred over actually solving modeling mathematical expressions for a large number of sample points.

It is preferred that pseudo locus 44 be established at an interpolated locus, such as at point (0.75, 0.5), because such a solution avoids discontinuity occurring at pseudo locus 44.

A complex process of evaluating placement of pseudo loci is described by Lewis ["Device Model Approximation Using $2^N$ Trees", by David M. Lewis; IEEE Transactions on Computer-Aided Designs, Vol. 9, No. 1; January 1990]. Lewis performs repeated passes through the tree describing the function domain (see, for example, tree 20; FIG. 3). Each pass first generates all constraints for every midpoint on every edge of all leaf partitions (i.e., each intercell boundary not coinciding with a boundary of the function domain). Duplicate restraints for a given locus are eliminated. The second part of each pass examines the points, and splits any leaf partition that has an edge point with more than one constraint. The process is repeated until no partitions are split, and each corner has at most one constraint. Function values are then assigned to the corners resulting in a continuous interpolation function $\hat{f}$. Lewis' method is complicated and time consuming. Making repeated passes through the function domain for evaluating loci in not an inconsequential task when the table model in the function domain involves many thousands of partitions, as is common with many device or product simulation or evaluation programs.

The present invention avoids repeated passes through the function domain and simplifies selection of pseudo loci for continuity partitions. The present invention simply establishes a continuity partition for each and every middle edge point encountered among the accuracy partitions or cells.

Figure 5:
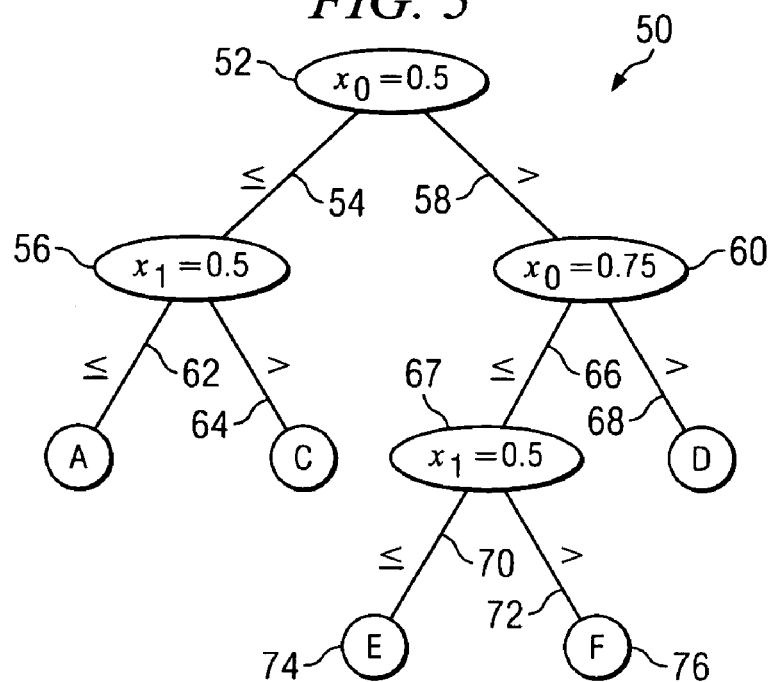
FIG. 5 is a two-dimensional binary space partition representation of the function domain illustrated in FIG. 4.

FIG. 5 is a two-dimensional binary space partition representation of the solution domain illustrated in FIG. 4. In FIG. 5, a BSP tree 50 (N=2) is illustrated that represents divided function domain 40 (FIG. 4). Tree 50 has a primary reference node 52 having a hyperplane or a line: [$x_0$=0.5]. A branch 54 from reference node 52 connects with a secondary reference node 56 having a hyperplane or a line: [$x_1$=0.5]. A branch 58 from reference node 52 connects with a secondary reference node 60 having a hyperplane or a line: [$x_0$=0.75]. A branch 62 from secondary reference node 56 connects with a leaf 63 representing accuracy partition or cell A. A branch 64 from secondary reference node 56 connects with a leaf 65 representing accuracy partition or cell C. A branch 66 from secondary reference node 60 connects with a new continuity reference node 67. A branch 68 from secondary reference node 60 connects with a leaf 69 representing accuracy partition or cell D. A branch 70 from new continuity reference node 67 connects with a leaf 74 representing continuity partition E. A branch 72 from new continuity reference node 67 connects with a leaf 76 representing continuity partition F.

One may observe that reference nodes 52, 56, 60 are related to intersections of partition edges with zero axes. Reference node 52 is related to intersection of a partition edge with the $x_1$=0 axis at a point (0.5, 0). Reference node 56 is related to intersection of a partition edge with the $x_0$=0 axis at a point (0, 0.5). Reference node 60 is related to intersection of a partition edge with the $x_1$=0 axis at a point (0.75, 0).

Inspecting FIG. 5 with reference to FIG. 4, one may notice that branch 54 includes $x_0$=0.5 and all points to the left of $x_0$=0.5. Branch 58 includes all points to the right of $x_0$=0.5. Branch 62 includes $x_0$=0.5 and all points to the left of $x_0$=0.5 for $x_1$=0.5 and for all points below $x_1$=0.5, viz; accuracy cell A. Branch 64 includes $x_0$=0.5 and all points to the left of $x_0$=0.5 for all points above $x_1$=0.5, viz; accuracy cell C. Branch 66 includes all points to the right of $x_0$=0.5 for $x_0$=0.75 and for all points to the left of $x_0$=0.75, viz; the horizontal expanse of continuity cells E, F (old accuracy cell B). Branch 68 includes all points to the right of $x_0$=0.5 and for all points to the right of $x_0$=0.75, viz; accuracy cell D. Branch 70 includes all points within the horizontal expanse of continuity cells E, F, and for $x_1$=0.5 and all points less than $x_1$=0.5. Branch 72 includes all points within the horizontal expanse of continuity cells E, F, and D all points greater than $x_1$=0.5.

The present invention searches for edge points to determine if a continuity partition is needed for a leaf partition or a cell. A data structure that represents the connectivity of a grid is created during accuracy partition to keep track of all the edge points.

Figure 6:
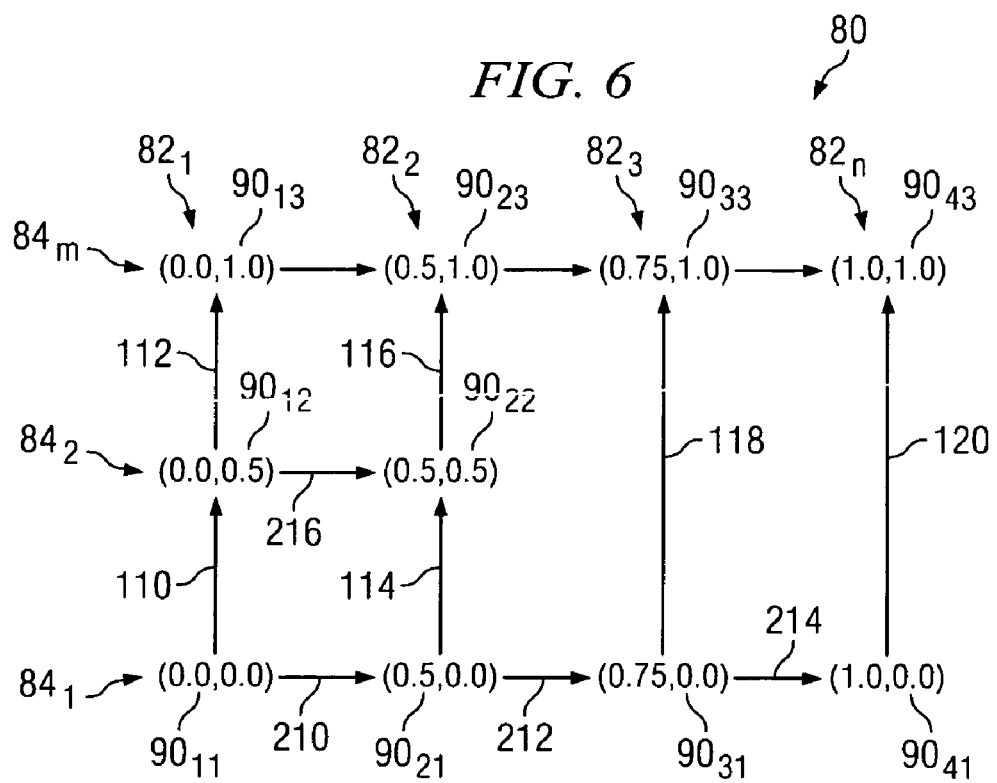
FIG. 6 is a schematic representation of data stored for representing the two-dimensional function domain with accuracy partitions illustrated n FIG. 2.

FIG. 6 is a schematic representation of data stored for representing the two-dimensional function domain (unstructured grid) with accuracy partitions illustrated n FIG. 2. In FIG. 6, a the connectivity data structure 80 includes a plurality of data elements arranged in columns $82_1$, $82_2$, $82_3$, $82_n$ and rows $84_1$, $84_2$, $84_m$. The indicator "n" is employed to signify that there can be any number of columns in the connectivity data structure 80. The inclusion of four columns $82_1$, $82_2$, $82_3$, $82_n$ in FIG. 6 is illustrative only and does not constitute any limitation regarding the number of columns that may be included in the connectivity data structure of the present invention. The indicator "m" is employed to signify that there can be any number of rows in connectivity data structure 80. The inclusion of three rows $84_1$, $84_2$, $84_m$ in FIG. 6 is illustrative only and does not constitute any limitation regarding the number of rows that may be included in the connectivity data structure of the present invention.

Each respective data element may be identified by an indicator $90_{nm}$ wherein n indicates the column in which a respective data element is located, and m indicates the row in which the respective data element is located. Thus, if rows $84_1$, $84_2$, $84_m$ in FIG. 6 are designated as Row 1, Row 2, Row 3, respectively, and if columns $82_1$, $82_2$, $82_3$, $82_n$ in FIG. 6 are designated as Column 1, Column 2, Column 3, Column 4, respectively, then data elements in FIG. 6 may be labeled as indicated using the $90_{nm}$ indicators.

Using the $90_{nm}$ indicators, connectivity data structure 80 includes data elements $90_{11}$, $90_{21}$, $90_{31}$, $90_{41}$ in Row 1. Connectivity data structure 80 includes data elements $90_{12}$, $90_{22}$ in Row 2. Connectivity data structure 80 includes data elements $90_{13}$, $90_{23}$, $90_{33}$, $90_{43}$ in Row 3.

Each data element $90_{nm}$ also includes at least one pointer to identify a next adjacent data element in connectivity data structure 80. In the preferred embodiment of connectivity data structure 80 data elements $90_{nm}$ include row pointers to identify the next adjacent data element in a higher row and also include column pointers to identify the next adjacent data element in a higher column. FIG. 6 is a graphic illustration to illustrate how connectivity data structure operates. Precise details of how data is actually stored in a database or other data store are not discussed. Any storage arrangement that permits operation as described in connection with FIG. 6 is within the scope of the present invention.

Data element $90_{11}$ includes a row pointer 110 pointing to data element $90_{12}$ and a column pointer 210 pointing to data element $90_{21}$. Data element $90_{21}$ includes a row pointer 114 pointing to data element $90_{22}$ and a column pointer 212 pointing to data element $90_{31}$. Data element $90_{31}$ includes a row pointer 118 pointing to data element $90_{33}$ (because the data storage site that would have contained a data element $90_{23}$ is empty) and a column pointer 212 pointing to data element $90_{41}$. Data element $90_{41}$ includes a row pointer 120 pointing to data element $90_{43}$ (because the data storage site that would have contained a data element $90_{42}$ is empty) and does not include a column pointer because there is not a data element located n a higher column in Row 1.

Data element $90_{12}$ includes a row pointer 112 pointing to data element $90_{13}$ and a column pointer 216 pointing to data element $90_{22}$. Data element $90_{22}$ includes a row pointer 116 pointing to data element $90_{23}$ and does not include a column pointer because there is not a data element located in a higher column in Row 2.

Data element $90_{13}$ includes no row pointer (because there is not a data element located in a higher row in Column 1) and a column pointer 218 pointing to data element $90_{23}$. Data element $90_{23}$ includes no row pointer (because there is not a data element located in a higher row in Column 2) and a column pointer 220 pointing to data element $90_{33}$. Data element $90_{33}$ includes no row pointer (because there is not a data element located in a higher row in Column 3) and a column pointer 222 pointing to data element $90_{43}$. Data element $90_{43}$ includes no row pointer (because there is not a data element located in a higher row in Column 4) and does not include a column pointer because there is not a data element located In a higher column in Row 3.

Inspecting FIG. 6 in connection with FIG. 2 reveals that data elements $90_{nm}$ in connectivity data structure 80 are coordinates of end points of partition boundaries of function domain 11. Data element $90_{11}$ corresponds with point 12. Data element $90_{21}$ corresponds with point 9. Data element $90_{31}$ corresponds with point 19. Data element $90_{41}$ corresponds with point 14. Data element $90_{12}$ corresponds with point 7. Data element $90_{22}$ corresponds with point 13. Data element $90_{13}$ corresponds with point 18. Data element $90_{23}$ corresponds with point 15. Data element $90_{33}$ corresponds with point 17. Data element $90_{43}$ corresponds with point 16.

Accommodation of connectivity data structure 80 to adding a pseudo locus or point, such as pseudo point 44 (FIG. 4) is easily accomplished. To accommodate including pseudo point 44 one must enter at data element site 90$_{23}$ a position (0.75, 0.5) and a new row pointer pointing to data element 90$_{33}$ (not shown in FIG. 7). Further, row pointer 118 would be amended to point to new data element 90$_{23}$. Such amendments to a data base to accommodate insertion (or even removal) of data points to a function domain is easily accomplished without significantly increasing computer running time.

To describe the novel data structure in N dimensions (FIG. 6 is a two-dimensional example; N=2), the new data structure represents the connectivity of a grid that is created during an accuracy partition operation to keep track of all edge points in N dimensions. Each grid point ($x^i_0$, $x^i_1$, ..., $x^i_{N-1}$) has N pointer fields that point to the adjacent grid points ($x^j_0$, $x^j_1$, ..., $x^j_{N-1}$) in each orthogonal direction that satisfy the following conditions:

$$p \neq k, \; x^i_p = x^j_p \quad [3]$$

$$p = k, \; x^i_k < x^j_k \quad [4]$$

where p=0, 1, ..., N−1; and $$0 \leq k \leq N-1$$

Not all grid points have N adjacent grid points that satisfy the above conditions in expressions [3] and [4] so some of their pointer fields are empty. FIG. 6 illustrates a connectivity data structure for a two-dimensional grid (N=2). By inspection one may observe that connectivity data structure 80 (FIG. 6) consists of three sorted singly linked lists in the $x_0$ direction (i.e., rows 84$_m$) and four linked lists in the $x_1$ direction (i.e., columns 82$_n$).

The present invention uses (N−1)-dimensional kd-trees to keep records of the heads of all the linked lists, which make searching for an existing point or inserting a new point very efficient. (Originally, the name kd-tree stood for k-dimensional tree, the trees shown in FIG. 7 would be called 1d-trees. Nowadays, the original meaning is lost, and what used to be called a 1d-tree is now called a 1-dimensional kd-tree.) Kd-trees are special type of BSP tree. A kd-tree deals a set of points. It partitions the space by half-planes such that each point is contained in its own region. The present invention builds a (N−1)-dimensional kd-tree for $x_i$ direction ($x_i$-coordinate). Each leaf of the kd-tree points to the head of a linked list in the $x_i$ direction. So N kd-trees are needed for an N-dimensional system. The connectivity data structure and kd-trees is created and updated during the process of binary space partition for both accuracy and continuity (described above). The data structure is used to identify edge points of a given cell and to determine whether a continuity partition is needed.

Figure 7:
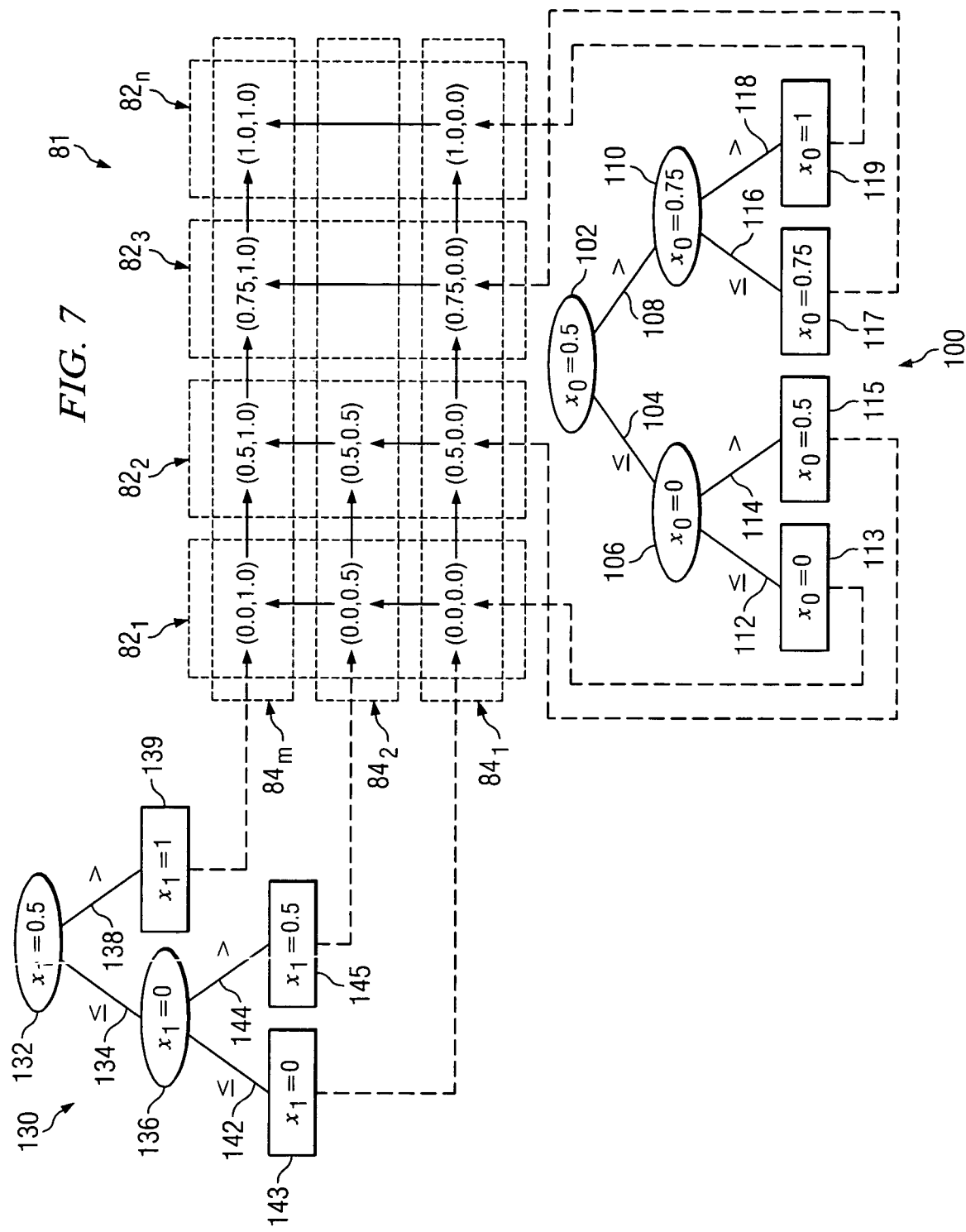
FIG. 7 illustrates binary space representations associated with a data store of the form illustrated in FIG. 6.

In FIG. 7, an example of two one-dimensional kd-trees for constructing a two-dimensional grid data array is shown. A first one-dimensional tree 100 relates to $x_0$-coordinate, which relates first tree to columns 82$_n$ (columns and rows will be referred to using the same reference numerals as are used in FIG. 6 in order to simplify this explanation). A second one-dimensional tree 130 relates to $x_1$-coordinate, which relates first tree to rows 82$_m$.

Tree 100 has a primary reference node 102 having a splitting point: [$x_0$=0.5]. A branch 104 from reference node 102 connects with a secondary reference node 106 having a hyperplane or a line: [$x_1$=0]. A branch 108 from reference node 102 connects with a secondary reference node 110 having a splitting point: [$x_1$=0.75]. A branch 112 from secondary reference node 106 connects with a terminator 113 representing a column 82, in a connectivity data structure 81. A branch 114 from secondary reference node 106 connects with a terminator 115 representing a column 82, in connectivity data structure 81. A branch 116 from secondary reference node 110 connects with a terminator 117 representing a column 823 in connectivity data structure 81. A branch 118 from secondary reference node 110 connects with a terminator 119 representing a column 82$_n$ in connectivity data structure 81.

Inspecting FIG. 7 with reference to FIG. 2, one may notice that branch 104 includes $x_0$=0.5 and all points to the left of $x_0$=0.5. Branch 108 includes all points to the right of $x_0$=0.5. Branch 112 includes $x_0$=0 and all points to the left of $x_0$=0. Branch 114 includes all points to the right of $x_0$=0. Branch 116 includes $x_0$=0.75 and all points to the left of $x_0$=0.75. Branch 118 includes all points to the right of $x_0$=0.75.

Tree 130 has a primary reference node 132 having a splitting point: [$x_1$=0.5]. A branch 134 from reference node 132 connects with a secondary reference node 136 having a splitting point: [$x_1$=0]. A branch 138 from reference node 132 connects with a terminator 139 representing a row 84$_m$ in a connectivity data structure 81. A branch 142 from secondary reference node 136 connects with a terminator 143 representing a row 84$_1$ in a connectivity data structure 81. A branch 144 from secondary reference node 136 connects with a terminator 145 representing a row 84$_2$ in connectivity data structure 81.

Inspecting FIG. 7 with reference to FIG. 2, one may notice that branch 134 includes $x_1$=0.5 and all points less than $x_1$=0.5. Branch 138 includes all points greater than $x_1$=0.5. Branch 142 includes $x_1$=0 and all points less than $x_1$=0. Branch 144 includes all points greater than $x_1$=0.

Trees 100, 130 provide a logical framework for assigning a given point ($x_0$, $x_1$) to a particular accuracy domain A, B, C, D in function domain 11 (FIG. 2) and locating data relating to that given point correctly in connectivity data structure 81. Trees 100, 130 also provide a logical framework for locating data relating to pseudo loci (e.g., point 44; FIG. 4) correctly in connectivity data structure 81. The ease with which pseudo points may be included in a connectivity data structure as they are added pursuant to a continuity partitioning operation, and the low additional storage overhead required for the connectivity data structure or for additions to the connectivity data structure, are particular strengths of the present invention.

Trees 100, 130 are only needed during grid generation and building of connectivity data structure to store information relating to the grid generated. Trees 100, 130 are not employed during table model evaluation or simulation. Accordingly it is preferred that tables 100, 130 be removed once generation of a table model grid is completed. That means that the only memory or storage overhead associated with the table model grid is a connectivity data structure containing point coordinates and pointer fields, as described in connection with FIG. 6 (connectivity data structure. 80) and FIG. 7 (connectivity data structure 81).

Inspection of connectivity data structure 80 reveals that points stored therein as data elements are corner points for partitions or cells. Providing a connectivity data structure 80 permits easy determination of edge points in connection with further partitioning for continuity partitioning. That is, because the corners of each leaf partition or cell is known, edge points may be easily identified by searching the part of a linked list (along a column or along a row; i.e., the edge) between two adjacent corners.

Monotonicity of device models is important for the robustness of circuit simulators based on the Newton-Raphson algorithm. If a device model function is monotonically increasing or decreasing, then the slope is always positive or negative. By way of example and not by way of limitation, for a MOSFET (metal oxide silicon field effect transistor) device, its drain-to-source current $I_{ds}$ always increases with an increase of $V_{gs}$ (gate-to-source voltage), $V_{ds}$ (drain-to-source voltage) and $V_{bs}$ (base-to-source voltage) in normal operating regions. So the 1$^{st}$ order derivatives (slopes) of the function $I_{ds}$ ($V_{gs}$, $V_{ds}$, $V_{bs}$) are always greater than zero, that is, the MOSFET device always has positive conductance. This monotonicity property of an analytical model is typically tested before the release of the model. Many circuit simulators check this property and generate a warning when non-monotonicity is detected.

For multi-linear interpolation such as is practiced in using a table model to evaluate a device, it can be proved that as long as the values at grid points are monotonic and an interpolated function is continuous, then the interpolated function is also monotonic. Proof is not included here for preserving simplicity in this disclosure.

Since interpolated values are used for the newly created grid points or corners (i.e., pseudo loci or points) during continuity partition, monotonicity of a model could be destroyed during a continuity partitioning operation. That is to say, while a device model function $f(x)$ is monotonic, the interpolated function $\hat{f}(x)$ is not necessarily monotonic after a continuity partitioning operation. By way of example and not by way of limitation, values at point 44 (FIG. 4) may no longer monotonic after creation of continuity partitions E, F because an interpolated value is assigned to pseudo corner 44.

Monotonicity preservation for table models using unstructured grid is not known by the inventor to have been addressed before. A grid refinement operation is provided by the preferred embodiment of the method of the present invention to solve this problem.

The grid refinement operation first checks monotonicity of leaf partitions that have at least one corner that uses an interpolated value (i.e., a pseudo corner). If a problem regarding monotonicity is detected, the grid refinement operation continues by going to the parent partition containing the leaf partition in which the problem was detected. This continuing to a parent partition continues until a partition without a single pseudo corner is reached. The partition having no pseudo corners will be the root of a subtree in the whole BSP (Binary Space Partition) tree. The grid refinement operation then converts all pseudo corners within that subtree to regular corners, that is the grid refinement operation replaces interpolated values at pseudo corners with actual function values.

Figure 8:
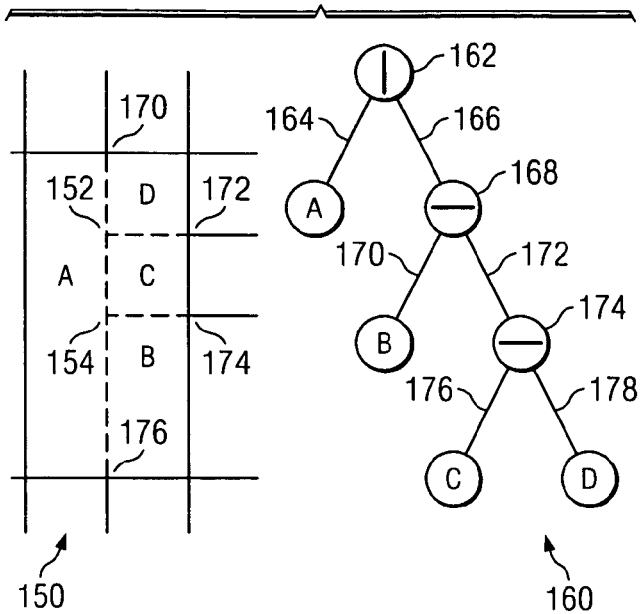
FIG. 8 is a schematic illustration of the grid refinement operation of the present invention showing a representative function domain and an associated binary space partition tree representation.

FIG. 8 is a schematic illustration of the grid refinement operation of the present invention showing a representative solution domain and an associated binary space partition tree representation. In FIG. 8, a parent partition 150 includes an accuracy partition A and continuity partitions B, C, D. Accuracy partitions are indicated using dotted line format. Continuity partitions B, C are in part defined by a pseudo corner 152. Continuity partitions C, D are in part defined by a pseudo corner 154.

A BSP (Binary Space Partition) tree 160 describes accuracy partition A and continuity partitions B, C, D. BSP tree 160 included a root 162 from which depend a branch 164 and a branch 166. Branch 166 terminates in accuracy partition A. Branch 166 terminates at a root 168. Root 168 is a root of a subtree defined by branches 170, 172. Branch 170 terminates in continuity partition B. Branch 172 terminates in a root 174. Rot 174 is a root of a subtree defined by branches 176, 178. Branch 176 terminates in continuity partition C. Branch 178 terminates in continuity partition D.

The grid refinement operation checks continuity partitions B, C, D to ascertain whether any of those partitions involves a pseudo point. In checking continuity partition D, pseudo point 152 is noted and a check for monotonicity is performed. Specifically, in the preferred embodiment of the present invention, corners in partition D that are adjacent to pseudo point 152 are evaluated with respect to the function f represented by the grid containing partitions A, B, C, D. That is, function f is solved for points 170, 172. If function f is monotonic between points 170, 172, then pseudo point 152 remains unchanged. If, however, function f is not monotonic between points 170, 172, then the grid refinement operation goes from partition D to root 174 of BSP tree 160. Now the grid refinement operation evaluates partitions C, D as one partition.

Now the grid refinement operation checks partitions C, D. Pseudo point 154 is noted and a check for monotonicity is performed. Specifically, in the preferred embodiment of the present invention, corners in partitions C, D that are adjacent to pseudo point 154 are evaluated with respect to the function f represented by the grid containing partitions A, B, C, D. That is, function f is solved for points 170, 174. If function f is monotonic between points 170, 174, then pseudo point 152 remains unchanged. If, however, function f is not monotonic between points 170, 174, then the grid refinement operation goes from root 174 of BSP tree 160 to root 168. Now the grid refinement operation evaluates partitions B, C, D as one partition.

Now the grid refinement operation checks partitions B, C, D. No pseudo points bound partition B, C, D. The grid refinement operation will then solve function f for points 152, 154 and substitute those values for points 152, 154. Substituting solved values for points 152, 154 assures monotonicity.

While grid refinement preserves monotonicity of device model functions, it could also introduce new step discontinuities on the boundary. Continuity partition and grid refinement have to be performed in a loop until there is no need for grid refinement.

Figure 9:
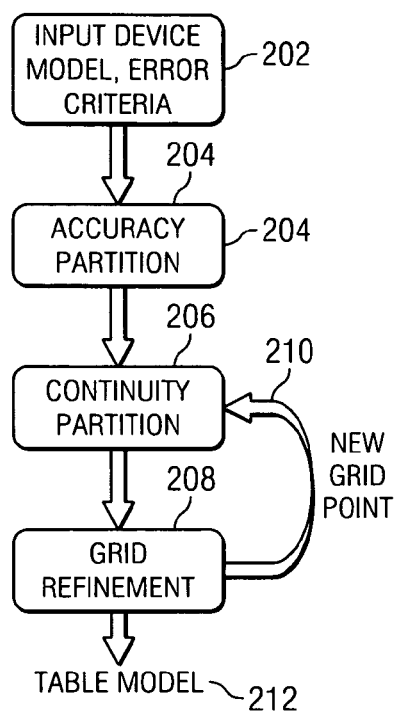
FIG. 9 is a flow chart illustrating the preferred embodiment of the method of the present invention.

FIG. 9 is a flow chart illustrating the preferred embodiment of the method of the present invention. In FIG. 9, a method 200 begins with establishing acceptable error criteria for functions to be evaluated by a table model, as indicated by a block 202. Method 200 continues with performing an accuracy partitioning operation, as indicated by a block 204. Method 200 continues with performing a continuity partitioning operation, as indicated by a block 206. Method 200 continues with performing a grid refinement operation, as indicated by a block 208. Method 200 continues with re-performing a continuity partitioning operation, as indicated by return arrow 210, in order to ensure that the grid refinement operation just performed did not introduce any discontinuities into the grid. Method 200 continues with re-performing a grid refinement operation, as indicated by block 208. The loop containing block 206, block 208 and arrow 210 is carried out until both a continuity partitioning operation (block 206) and a grid refinement operation (block 208) are successfully performed on all partitions in the grid with no discontinuities or monotonicity problem noted. Thereafter method 200 proceeds to step 212, indicating that an acceptable table model has been established.

The method for effecting continuity partitioning according to the preferred embodiment of the present invention is summarized in the following procedure:

(A) For each partition:
  (1) For each dimension i:
    (a) Find number of middle edge points with real function values in the ith direction; return to (A)(1) until all dimensions i are addressed;
  (2) Find the direction with the maximum number of middle edge points, $i_{max}$;
  (3) If there is still at least one middle edge point,
    (a) Split the current partition on (or perpendicular to) the $i_{max}$ direction;
    (b) Assign an interpolated value to newly created grid points (i.e., pseudo points) if there is any;
    (c) Insert newly created grid points into the linked list using kd-trees if there is any;
    (d) Create continuity partition (right child);
    (e) Create continuity partition (left child), return to (A)(2) until all dimensions i are addressed;
  (4) Else (i.e., if there are no middle edge points associated with the partition ):
    (a) Mark the partition as a leaf partition;
(B) Next partition, until all partitions are addressed.

There is an important aspect of the preferred embodiment of the present invention the preferred method of tree traversal that should be stressed. During a table model evaluation, a tree traversal finds the smallest partition (cell or leaf partition) that includes the given bias point. Prior art methods use the root of the BSP tree are the starting point for tree traversal.

Figure 10:
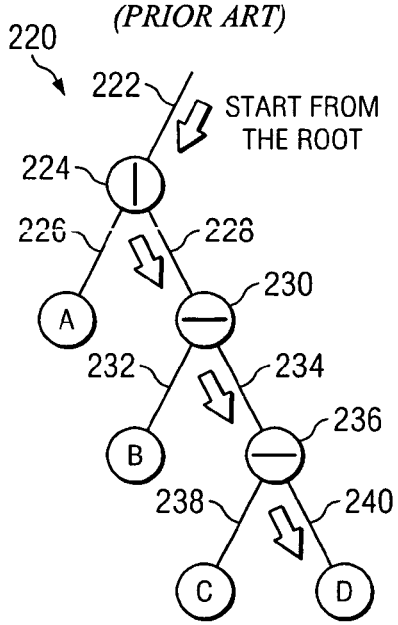
FIG. 10 is a schematic diagram illustrating a prior art method for tree traversal.

FIG. 10 is a schematic diagram illustrating a prior art method for tree traversal. In FIG. 10, a representative BSP (Binary Space Partition) tree section 220 includes a node 224 that depends from a branch 222. Branch 222 comes from higher in the tree (not shown in FIG. 10). A branch 226 and a branch 228 depend from root 224. Branch 226 terminates in a partition A. Branch 228 terminates at a node 230. Node 230 is a root of a subtree defined by branches 232, 234. Branch 232 terminates in a partition B. Branch 234 terminates in a node 236. Node 236 is a root of a subtree defined by branches 238, 240. Branch 238 terminates in a partition C. Branch 240 terminates in a partition D.

Traversals of tree 220 may be effected for table model evaluation. Prior art methods of traversing a BSP tree such as tree 220 involved a "top down" approach. That is, traversal begins at the top of the tree at the most basic root (not shown in FIG. 10), proceeds via various branches to reach node 224, then proceeds down branches 228, 234 240 and roots 230 234 to reach a partition, such as partition D.

It has been found that changes of bias points between evaluations are often very small. Sometimes the current and previous bias points are found in the same cell. The present invention uses a more efficient method that remembers the address of the cell that is last visited and uses it as the starting point of the tree traversal for the next evaluation.

Figure 11:
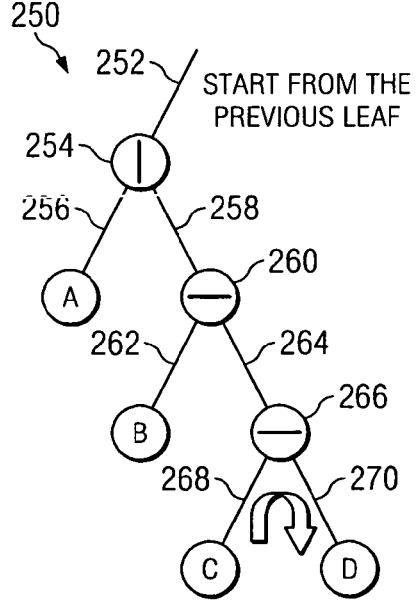
FIG. 11 is a schematic diagram illustrating the preferred method of tree traversal of the present invention.

FIG. 11 is a schematic diagram illustrating the preferred method of tree traversal of the present invention. In FIG. 11, a representative BSP (Binary Space Partition) tree section 250 includes a node 254 that depends from a branch 252. Branch 252 comes from higher in the tree (not shown in FIG. 11). A branch 256 and a branch 258 depend from node 254. Branch 256 terminates in a partition A. Branch 258 terminates at a node 260. Node 260 is a root of a subtree defined by branches 262, 264. Branch 262 terminates in a partition B. Branch 264 terminates in a node 266. Node 266 is a root of a subtree defined by branches 268, 270. Branch 268 terminates in a partition C. Branch 270 terminates in a partition D.

Traversals of tree 250 may be effected for table model evaluation. The preferred method for traversing tree 250 is to begin from a remembered starting point, for example partition C, and move up the tree to the next node encountered, such as node 266. Then one proceeds to the other branch emanating from node 266 to reach partition D. If another partition is sought, then one proceeds further up tree 250 to another node, such as node 260, but only so far up tree 250 as is necessary to reach a desired partition. Useless traversal of higher levels of the BSP tree is thus avoided and tree traversal is effected in a more efficient speedy manner.

It is to be understood that, while the detailed drawings and specific examples given describe preferred embodiments of the invention, they are for the purpose of illustration only, that the apparatus and method of the invention are not limited to the precise details and conditions disclosed and that various changes may be made therein without departing from the spirit of the invention which is defined by the following claims:

I claim:

1. A computer-readable medium including a data structure for storing information representing connectivity of a grid identified in n dimensions during a partition operation; the data structure comprising;
  (a) a plurality of grid points $(x^i_0, x^i_1, \ldots, x^i_{n-1})$; each respective grid point of said plurality of grid points representing an edge point of a partition in said grid;
  (b) for each said respective grid point, a plurality of up to n pointer fields; each respective pointer field of said plurality of up to n pointer fields identifying an occupied next-adjacent grid point $(x^j_0, x^j_1, \ldots, x^j_{n-1})$ of said plurality of grid points in each of up to n orthogonal directions; said occupied next-adjacent grid point satisfying the conditions:

$$\text{if } p \neq k \text{ then } x^i_p = x^j_p; \text{ and} \quad (1)$$

$$\text{if } p = k \text{ then } x^i_k < x^j_p; \quad (2)$$

where p = 0, 1, ..., n−1; and where $0 \leq k \leq n-1$.

2. The computer-readable medium as recited in claim 1 wherein n equals 3.

3. The computer-readable medium as recited in claim 1 wherein n equals 2.

* * * * *